(12) United States Patent
Yamaguchi

(10) Patent No.: US 11,843,208 B2
(45) Date of Patent: Dec. 12, 2023

(54) ADAPTER FOR CONNECTING BATTERY AND ELECTRICAL DEVICE

(71) Applicant: MAKITA CORPORATION, Anjo (JP)

(72) Inventor: Junya Yamaguchi, Anjo (JP)

(73) Assignee: MAKITA CORPORATION, Anjo (JP)

( * ) Notice: Subject to any disclaimer, the term of this patent is extended or adjusted under 35 U.S.C. 154(b) by 0 days.

(21) Appl. No.: 18/077,715

(22) Filed: Dec. 8, 2022

(65) Prior Publication Data

US 2023/0105949 A1    Apr. 6, 2023

Related U.S. Application Data

(63) Continuation of application No. 17/083,484, filed on Oct. 29, 2020, now Pat. No. 11,557,870.

(30) Foreign Application Priority Data

Nov. 18, 2019   (JP) .................... 2019-208166
Nov. 18, 2019   (JP) .................... 2019-208168

(51) Int. Cl.
| | | |
|---|---|---|
| *G01R 31/36* | (2020.01) | |
| *H01R 33/94* | (2006.01) | |
| *H01R 33/945* | (2006.01) | |
| *H01R 33/965* | (2006.01) | |
| *H01R 13/453* | (2006.01) | |

(52) U.S. Cl.
CPC ......... *H01R 33/94* (2013.01); *G01R 31/3644* (2013.01); *H01R 33/945* (2013.01); *H01R 33/965* (2013.01); *H01R 13/4534* (2013.01); *H01R 2201/20* (2013.01)

(58) Field of Classification Search
CPC .................................... G01R 31/3644
USPC ...................................... 439/76.1
See application file for complete search history.

(56) References Cited

U.S. PATENT DOCUMENTS

| | | |
|---|---|---|
| 5,592,064 A | 1/1997 | Morita |
| 5,974,334 A | 10/1999 | Jones, Jr. |
| 6,502,949 B1 * | 1/2003 | Horiyama .......... B23Q 17/2404 362/198 |

(Continued)

FOREIGN PATENT DOCUMENTS

| | | | |
|---|---|---|---|
| JP | H06-217466 A | 8/1994 | |
| JP | 2001-245436 A | 9/2001 | |

(Continued)

OTHER PUBLICATIONS

Jun. 6, 2023 Office Action issued in Japanese Patent Application No. 2019-208168.

(Continued)

*Primary Examiner* — Nathaniel R Pelton
(74) *Attorney, Agent, or Firm* — Oliff PLC

(57) ABSTRACT

An adapter may be configured to connect a battery and an electrical device to each other. The adapter may include a control board; a battery-side terminal mounted on a first surface of the control board and configured to be electrically connectable to the battery; and a device-side terminal mounted on a second surface of the control board and configured to be electrically connectable to the electrical device, the second surface being opposite from the first surface.

8 Claims, 10 Drawing Sheets

(56) References Cited

U.S. PATENT DOCUMENTS

| | | | |
|---|---|---|---|
| 9,415,499 B2* | 8/2016 | Brotto | H01M 50/296 |
| 2001/0017531 A1* | 8/2001 | Sakakibara | H02J 7/00047 |
| | | | 320/106 |
| 2002/0125857 A1* | 9/2002 | Mastaler | H02J 7/0045 |
| | | | 320/112 |
| 2005/0017686 A1 | 1/2005 | Sakakibara et al. | |
| 2007/0182373 A1 | 8/2007 | Sakakibara et al. | |
| 2007/0210744 A1* | 9/2007 | Watson | H01M 50/296 |
| | | | 320/112 |
| 2007/0224492 A1* | 9/2007 | Scott | H01M 50/247 |
| | | | 429/99 |
| 2016/0294093 A1 | 10/2016 | Ogura | |
| 2017/0294787 A1 | 10/2017 | Taga | |
| 2019/0259984 A1 | 8/2019 | Nishikawa et al. | |
| 2019/0259985 A1 | 8/2019 | Hanawa et al. | |
| 2019/0260209 A1 | 8/2019 | Nishikawa et al. | |

FOREIGN PATENT DOCUMENTS

| | | |
|---|---|---|
| JP | 2001-300867 A | 10/2001 |
| JP | 2004-023875 A | 1/2004 |
| JP | 2005-235472 A | 9/2005 |
| JP | 2014-100033 A | 5/2014 |
| JP | 2016-157783 A | 9/2016 |
| JP | 2016-196051 A | 11/2016 |
| WO | 2018/079722 A1 | 5/2018 |

OTHER PUBLICATIONS

Jun. 6, 2023 Office Action issued in Japanese Patent Application No. 2019-208166.

Oct. 31, 2023 Office Action issued in Japanese Patent Application No. 2019-208168.

* cited by examiner

ABSTRACT> # ADAPTER FOR CONNECTING BATTERY AND ELECTRICAL DEVICE

CROSS-REFERENCE TO RELATED APPLICATION

This is a Continuation of application Ser. No. 17/083,484 filed Oct. 29, 2020, which claims priority to Japanese Patent Application No. 2019-208166, filed on Nov. 18, 2019 and Japanese Patent Application No. 2019-208168, filed on Nov. 18, 2019, the entire contents of which are hereby incorporated by reference into the present application.

TECHNICAL FIELD

The disclosure herewith relates to an adapter.

BACKGROUND

Japanese Patent Application Publication No. 2001-300867 describes an adapter. The adapter is configured to connect a battery and an electrical device to each other. The adapter includes a control board, a battery-side terminal, and a device-side terminal. The battery-side terminal is mounted on the control board and is configured to be electrically connectable to the battery. The device-side terminal is connected to the control board via a lead and is configured to be electrically connectable to the electrical device.

SUMMARY

In the above-described adapter, the device-side terminal is connected to the control board via a lead. This requires a space for disposing the lead to be provided, resulting in increase in size of the adapter. The present disclosure discloses a technology that can prevent increase in size of an adapter.

The disclosure herein discloses an adapter. The adapter may be configured to connect a battery and an electrical device to each other. The adapter may comprise a control board, a battery-side terminal, and a device-side terminal. The battery-side terminal may be mounted on a first surface of the control board and configured to be electrically connectable to the battery. The device-side terminal may be mounted on a second surface of the control board and configured to be electrically connectable to the electrical device, the second surface being opposite from the first surface.

In the above configuration, since the battery-side terminal and the device-side terminal are both mounted on the control board, the battery-side terminal and the device-side terminal are disposed on the control board without use of another member such as a lead. Due to this, a space for disposing the lead is not required to be provided, which can prevent increase in size of the adapter.

DETAILED DESCRIPTION

Figure 1:
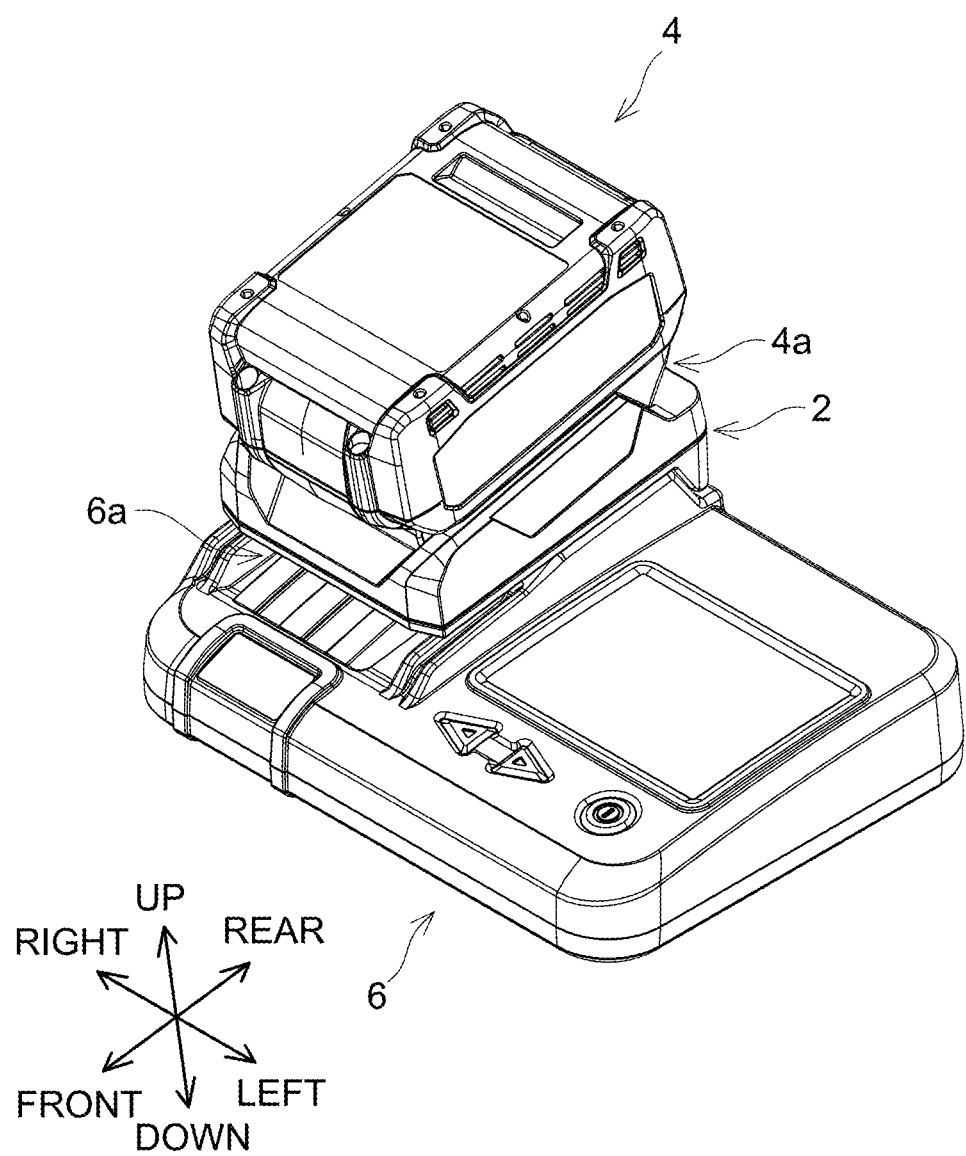
FIG. 1 is a perspective view of an adapter 2 of a first embodiment, and a battery 4 and a battery checker 6 are connected to each other with the adapter 2.

Representative, non-limiting examples of the present disclosure will now be described in further detail with reference to the attached drawings. This detailed description is merely intended to teach a person of skill in the art further details for practicing preferred aspects of the present teachings and is not intended to limit the scope of the present disclosure. Furthermore, each of the additional features and teachings disclosed below may be utilized separately or in conjunction with other features and teachings to provide improved adapters, as well as methods for using and manufacturing the same.

Moreover, combinations of features and steps disclosed in the following detailed description may not be necessary to practice the present disclosure in the broadest sense, and are instead taught merely to particularly describe representative examples of the present disclosure. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

In one or more embodiments, an adapter may be configured to connect a battery and an electrical device to each other. The adapter may comprise a control board, a battery-side terminal, and a device-side terminal. The battery-side terminal may be mounted on a first surface of the control board and configured to be electrically connectable to the battery. The device-side terminal may be mounted on a second surface of the control board and configured to be electrically connectable to the electrical device, the second surface being opposite from the first surface.

In the above configuration, since the battery-side terminal and the device-side terminal are both mounted on the control board, the battery-side terminal and the device-side terminal are disposed on the control board without use of another member such as a lead. Due to this, a space for disposing the lead is not required to be provided, which can prevent increase in size of the adapter.

In one or more embodiments, the adapter may further comprise: a battery mounting portion to which a battery-side mounting portion of the battery is to be detachably attached; and a device mounting portion to which a device-side mounting portion of the electrical device is to be detachably attached. The battery-side mounting portion of the battery may be configured to be unattachable to the device-side mounting portion of the electrical device.

The above configuration enables the battery and the electrical device, which cannot be connected directly to each other, to be connected to each other via the adapter.

In one or more embodiments, the electrical device may be configured to be detachably attached to the adapter by being slid in a slide direction with respect to the adapter. The battery-side terminal may be disposed to be offset from the device-side terminal in the slide direction.

In a case where the battery-side terminal is mounted on the first surface of the control board and the device-side terminal is mounted on the second surface of the control board, the battery-side terminal needs to be disposed to be offset from the device-side terminal. If the battery-side terminal is disposed to be offset from the device-side terminal, however, the adapter may be increased in size. In the above configuration, the battery-side terminal is disposed to be offset from the device-side terminal in the slide direction. In a configuration in which the electrical device is configured to be detachably attached by being slid with respect to the adapter, the adapter usually has an enough size in the slide direction, thus the adapter can be prevented from being increased in size in the slide direction, even in a case where the battery-side terminal is disposed to be offset from the device-side terminal in the slide direction.

In one or more embodiments, the adapter may further comprise: a housing which houses the control board; and a water blocking wall disposed inside the housing. The housing may include an opening facing the battery when the battery is attached to the adapter. The water blocking wall may be disposed to isolate the opening from the control board.

In the above configuration, the water blocking wall prevents water that has entered an inside of the housing from the opening from flowing toward the control board. This can prevent the water from reaching the control board.

In one or more embodiments, the housing may include a water blocking groove configured to receive water which has entered an inside of the housing from the opening and flows along the water blocking wall. A distal end of the water blocking wall may be disposed in the water blocking groove.

In the above configuration, the water blocking groove functions as a water receiver configured to receive the water that has entered the inside of the housing from the opening. This can prevent the water from reaching the control board.

In one or more embodiments, the housing may further include a drain opening configured to drain water which has entered the inside of the housing from the opening to an outside of the housing. The drain opening may be disposed in the water blocking groove.

In the above-described configuration, the water trapped in the water blocking groove is drained from the drain opening to the outside of the housing. This can prevent the water from remaining trapped inside the housing.

In one or more embodiments, the adapter may further comprise a housing which houses the control board. The housing may include a battery mounting surface and a device mounting surface. The battery may be attached to the battery mounting surface. The device mounting surface may be opposite from the battery mounting surface and the electrical device may be attached to the device mounting surface. The battery mounting surface may be inclined relative to the device mounting surface.

In the above configuration, the battery mounting surface is inclined relative to the device mounting surface. Therefore, even when a member such as a hook is provided, the housing can have a required height at and near a portion where the member such as a hook is provided and can have a decreased height at another portion. This can further downsize the adapter.

In one or more embodiments, the battery mounting surface may be inclined relative to the device mounting surface at an angle that is larger than 0 degrees and smaller than or equal to 10 degrees.

The above configuration can prevent the battery mounting surface from being excessively inclined relative to the device mounting surface. This can prevent increase in size of the adapter.

In one or more embodiments, the battery may be configured to be detachably attached to the adapter by being slid with respect to the adapter. The battery-side terminal may comprise a protrusion which protrudes from the battery mounting surface. The protrusion may include a distal surface located farthest from the battery mounting surface. The distal surface may be parallel to the battery mounting surface.

The above configuration can prevent the distal surface of the battery-side terminal from catching on the battery when the battery is slid along the battery mounting surface of the adapter. This enables the battery to be easily attached to the adapter.

In one or more embodiments, a front direction may be defined as a direction in which the battery is slid to be attached to the adapter. The protrusion may include a rear surface. The rear surface may be perpendicular to the battery mounting surface.

The above configuration can prevent the rear surface of the battery-side terminal from catching on the battery when the battery is slid along the battery mounting surface of the adapter. This enables the battery to be easily attached to the adapter.

In one or more embodiments, the electrical device may be configured to be detachably attached to the adapter by being slid with respect to the adapter. The device-side terminal may comprise a protrusion which protrudes from the device mounting surface. The protrusion may include a distal surface located farthest from the device mounting surface. The distal surface may be parallel to the device mounting surface.

The above configuration can prevent the distal surface of the device-side terminal from catching on the electrical device when the electrical device is slid along the device mounting surface of the adapter. This enables the adapter to be easily attached to the electrical device.

In one or more embodiments, a front direction may be defined as a direction in which the adapter is slid to be attached to the electrical device. The protrusion may include a rear surface. The rear surface may be perpendicular to the device mounting surface.

The above configuration can prevent the rear surface of the device-side terminal from catching on the electrical device when the electrical device is slid along the device mounting surface of the adapter. This enables the adapter to be easily attached to the electrical device.

In one or more embodiments, the adapter may further comprise a display disposed on the battery mounting surface and configured to display information of the electrical device.

According to the above configuration, when the device mounting surface is placed horizontal to a placement surface, the battery mounting surface is inclined relative to the placement surface. The display is thus inclined relative to the placement surface. This enables an operator to easily see the display in comparison with a case where the display is horizontal to the placement surface.

In one or more embodiments, an adapter may be configured to connect a battery and an electrical device to each other. The adapter may comprise a housing, a control board, and a terminal. The control board may be housed in the housing. The terminal may be mounted on the control board. The housing may include a battery mounting surface and a device mounting surface. The battery may be attached to the battery mounting surface. The device mounting surface may be opposite from the battery mounting surface and the electrical device may be attached to the device mounting surface. The battery mounting surface may be inclined relative to the device mounting surface.

In the above configuration, the battery mounting surface is inclined relative to the device mounting surface. Therefore, even when a member such as a hook is provided, the housing can have a required height at and near a portion where the member such as a hook is provided and can have a decreased height at another portion. This can further downsize the adapter.

First Embodiment

With reference to FIGS. 1 to 9, an adapter 2 according to a first embodiment will be described. The adapter 2 is used to connect a battery 4 and a battery checker 6 to each other. The battery 4 is a battery used by being attached to a power tool such as a driver or a drill, or power work equipment such as a string trimmer or a blower. The battery 4 is, for example, a lithium-ion battery. The battery checker 6 is an electrical device that conforms with the battery 4. The battery checker 6 is an electrical device for displaying, for example, remaining life of the battery 4 or the cumulative number of charges of the battery 4. When the battery 4 fails, the battery checker 6 also displays a point of failure. For example, in a case where an old-model battery 4 and an old-model battery checker 6 are configured to be connectable to each other, and where a late-model battery 4 and the old-model battery checker 6 are not configured to be connectable to each other, the adapter 2 that can connect the late-model battery 4 and the old-model battery checker 6 is prepared so as to connect the late-model battery 4 to the old-model battery checker 6. In a case where the old-model battery 4 and a late-model battery checker 6 are not configured to be connectable to each other, the adapter 2 that can connect the old-model battery 4 and the late-model battery checker 6 may be prepared so as to connect the old-model battery 4 to the late-model battery checker 6.

As shown in FIG. 1, the battery 4 includes a lower surface on which a battery-side mounting portion 4a is provided. The battery checker 6 includes an upper surface on which a checker-side mounting portion 6a is provided. The checker-side mounting portion 6a of the battery checker 6 is unattachable to the battery-side mounting portion 4a of the battery 4. The battery-side mounting portion 4a of the battery 4 is therefore unattachable to the checker-side mounting portion 6a of the battery checker 6. The adapter 2 includes a lower surface on which a checker mounting portion 8 (see FIG. 8) attachable to the checker-side mounting portion 6a of the battery checker 6 is provided. The adapter 2 includes an upper surface on which a battery mounting portion 10 (see FIG. 2) attachable to the battery-side mounting portion 4a of the battery 4 is provided. The adapter 2 is detachably attached to the battery checker 6 by sliding the checker mounting portion 8 of the adapter 2 with respect to the checker-side mounting portion 6a of the battery checker 6. The battery 4 is detachably attached to the adapter 2 by sliding the battery-side mounting portion 4a of the battery 4 with respect to the battery mounting portion 10 of the adapter 2. The battery 4 is connected to the battery checker 6 via the adapter 2 by attaching the adapter 2 to the battery checker 6 and attaching the battery 4 to the adapter 2. Hereinafter, a direction in which the adapter 2 is slid with respect to the battery checker 6 will be called a front-rear direction, a direction perpendicular to the front-rear direction will be called a right-left direction, and a direction perpendicular to the front-rear direction and the right-left direction will be called an up-down direction.

Figure 2:
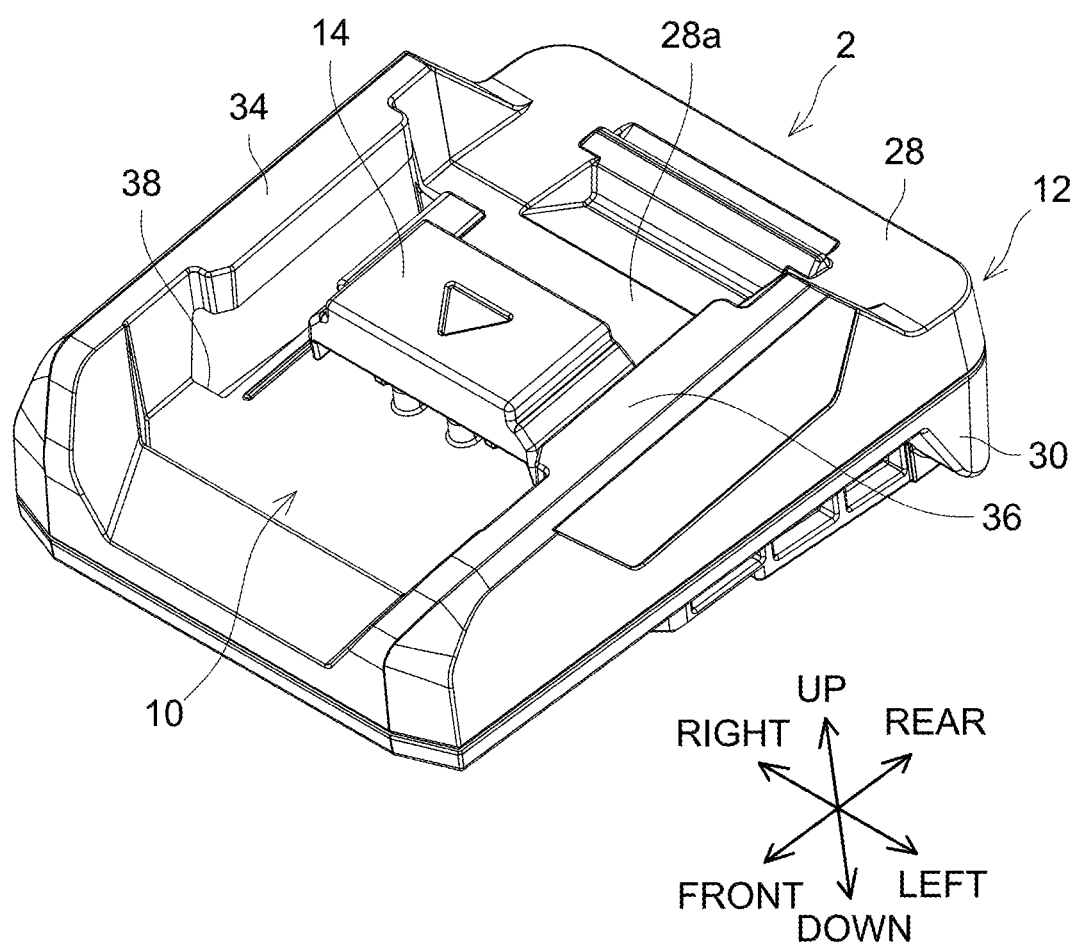
FIG. 2 is a perspective view of the adapter 2 of the first embodiment with a terminal cover 14 being at a protecting position.
Figure 8:
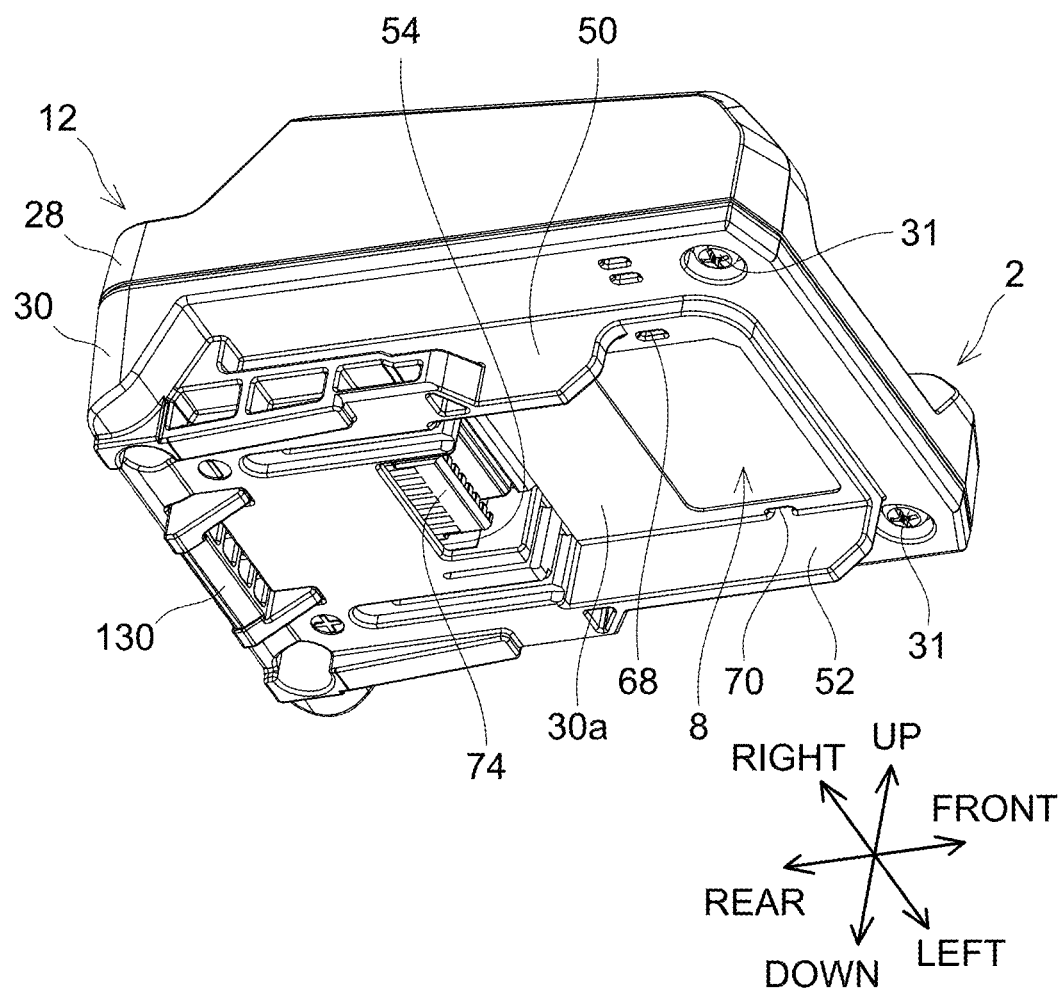
FIG. 8 is a perspective view of the upper housing 28 and the lower housing 30 of the first embodiment when seen from below.

As shown in FIG. 2, the adapter 2 comprises a housing 12 and a terminal cover 14. The housing 12 comprises an upper housing 28 and a lower housing 30. The upper housing 28 defines an outer shape of an upper portion of the adapter 2. The battery mounting portion 10 is provided on an upper surface 28a of the upper housing 28. The lower housing 30 defines an outer shape of a lower portion of the adapter 2. As shown in FIG. 8, the checker mounting portion 8 is provided on a lower surface 30a of the lower housing 30. The upper housing 28 and the lower housing 30 are fixed to each other with screws 31.

As shown in FIG. 2, rails 34, 36, openings 38, 40 (for the opening 40, see FIGS. 4 to 7), and terminal mounting portions 42 (see FIG. 4) are formed on the upper housing 28. The rails 34, 36 have a longitudinal direction along a slide direction in which the battery 4 is slid with respect to the adapter 2. The rail 34 is disposed at a right end of the upper surface 28a of the upper housing 28. The rail 36 is disposed at a left end of the upper surface 28a of the upper housing 28. When the battery-side mounting portion 4a of the battery 4 is to be attached to the battery mounting portion 10 of the adapter 2, the rails 34, 36 guide the battery-side mounting portion 4a in the front-rear direction.

Figure 4:
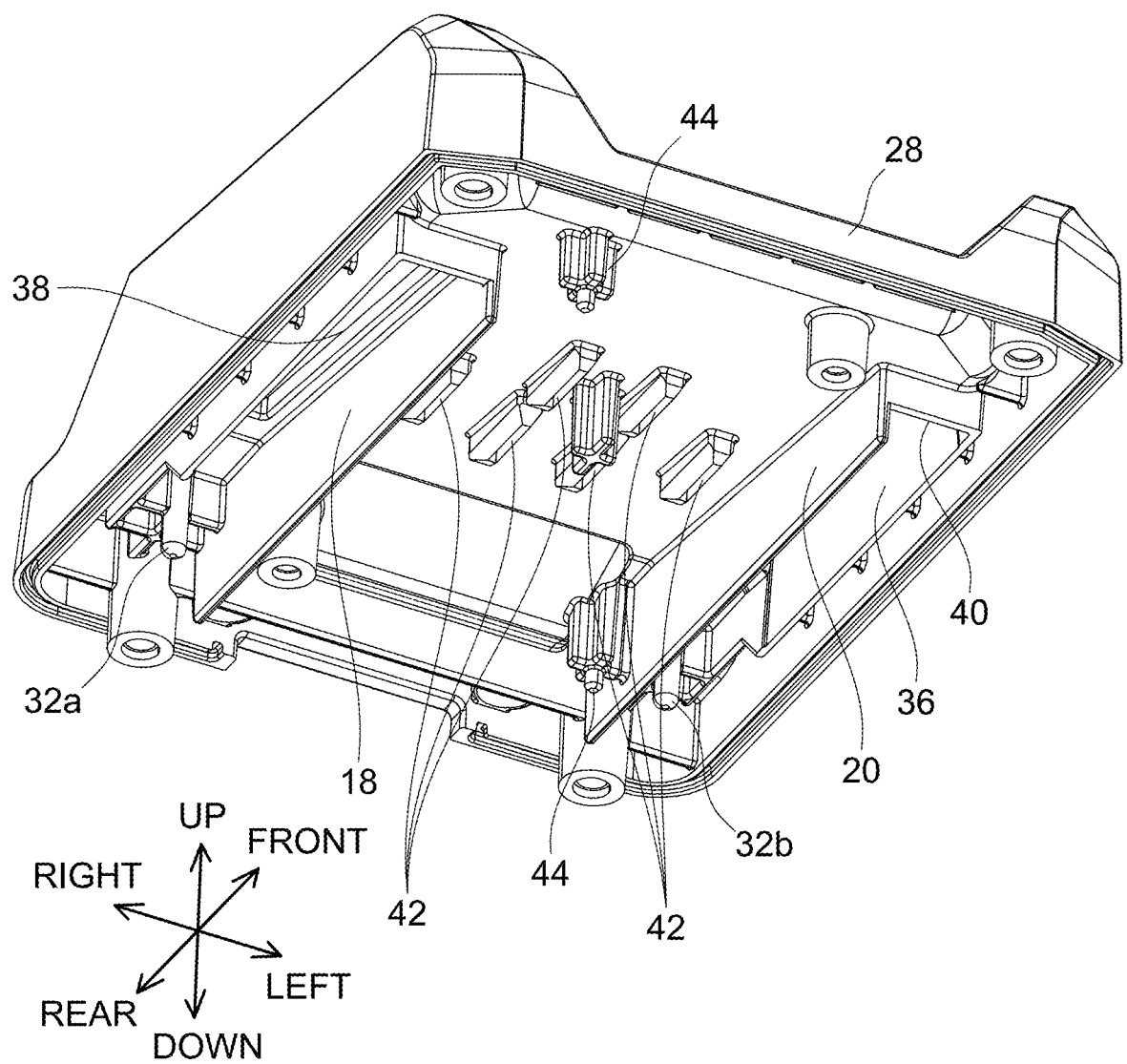
FIG. 4 is a perspective view of an upper housing 28 of the first embodiment when seen from below.
Figure 6:
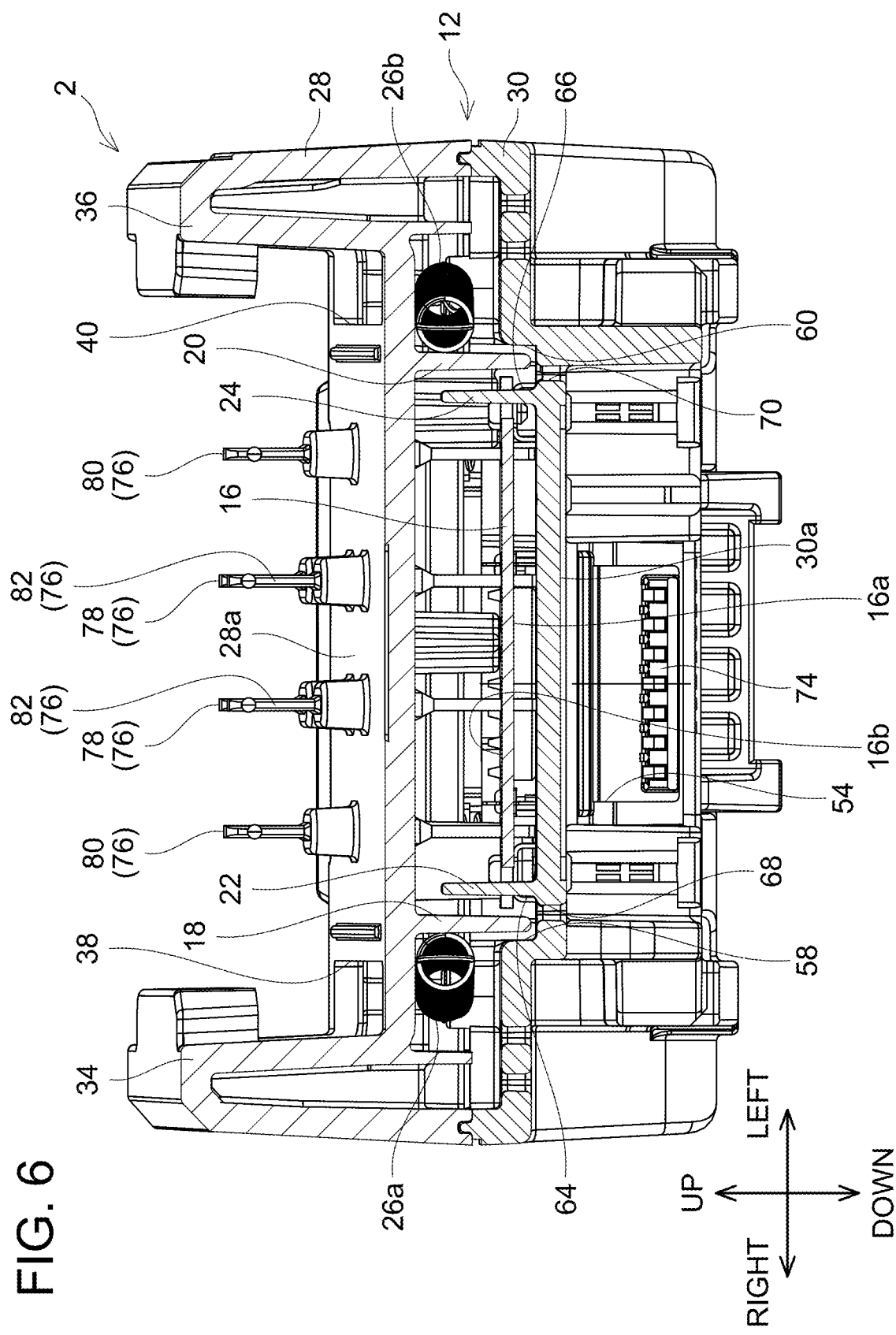
FIG. 6 is a cross-sectional view of the adapter 2 of the first embodiment cut perpendicularly to a front-rear direction.

The opening 38 is disposed close to the rail 34. The opening 38 has a longitudinal direction along the slide direction. As shown in FIG. 6, the opening 40 is disposed close to the rail 36. As shown in FIG. 4, the opening 40 has a longitudinal direction along the slide direction. When the battery 4 is attached to the adapter 2, the openings 38, 40 face the battery 4. The terminal mounting portions 42 are disposed between the rails 34, 36.

Figure 3:
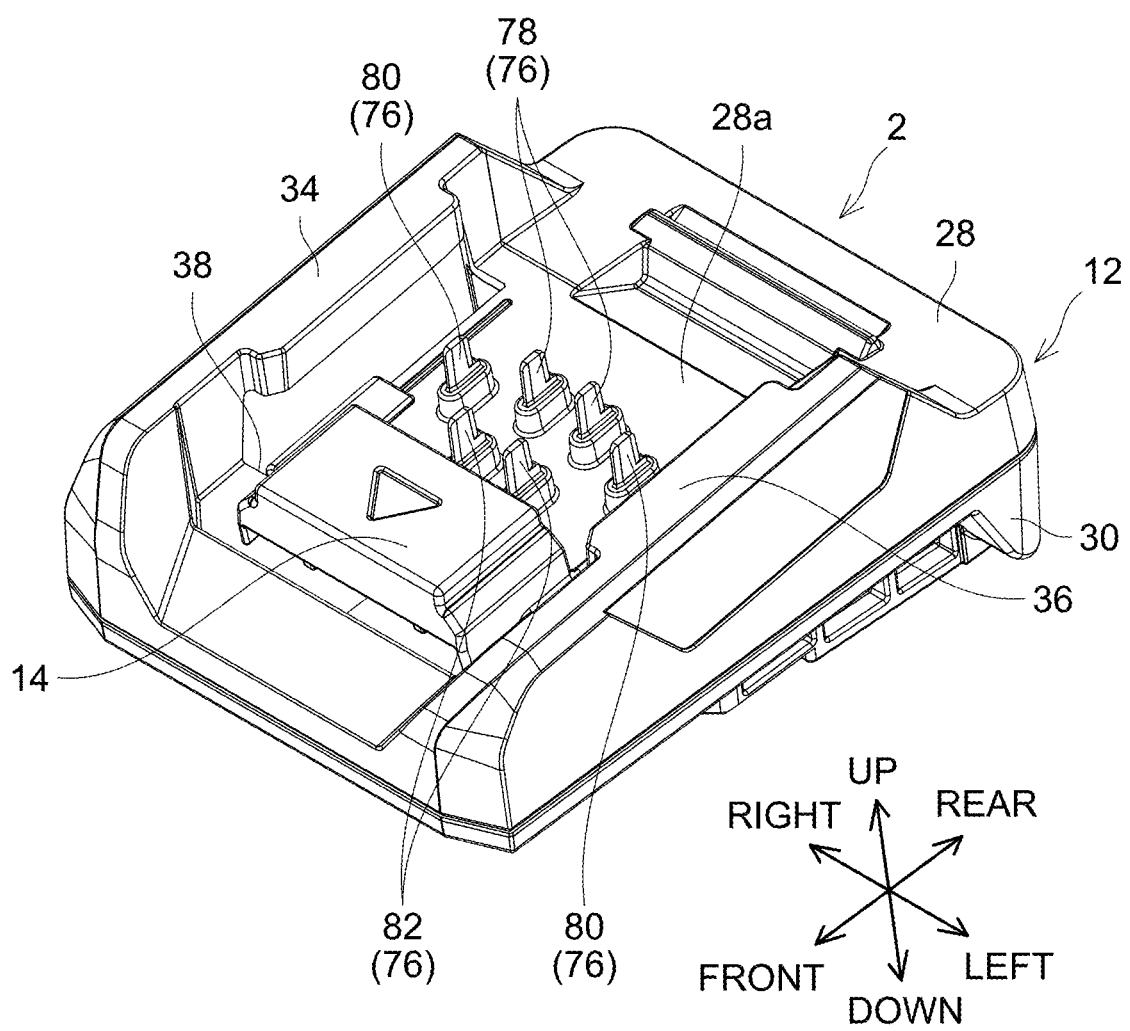
FIG. 3 is a perspective view of the adapter 2 of the first embodiment with the terminal cover 14 being at an exposing position.

As shown in FIGS. 2 and 3, a right end of the terminal cover 14 is slidably attached to a left edge of the opening 38 of the upper housing 28. A left end of the terminal cover 14 is slidably attached to a right edge of the opening 40 of the upper housing 28. The terminal cover 14 is held by the upper housing 28 slidably in the front-rear direction. The terminal cover 14 is slidable between a protecting position (see FIG. 2) at which it covers battery-side terminals 76 to be described below and an exposing position (see FIG. 3) at which it exposes the battery-side terminals 76. The terminal cover 14 is biased by biasing springs 26a, 26b (see FIG. 7) in a direction from the exposing position toward the protecting position. Therefore, in a state where the battery 4 is not attached to the adapter 2, the terminal cover 14 is held at the protecting position as shown in FIG. 2. In a case where the battery 4 is to be attached to the adapter 2, the terminal cover 14 is pressed by the battery 4 to thereby move from the protecting position to the exposing position.

Figure 5:
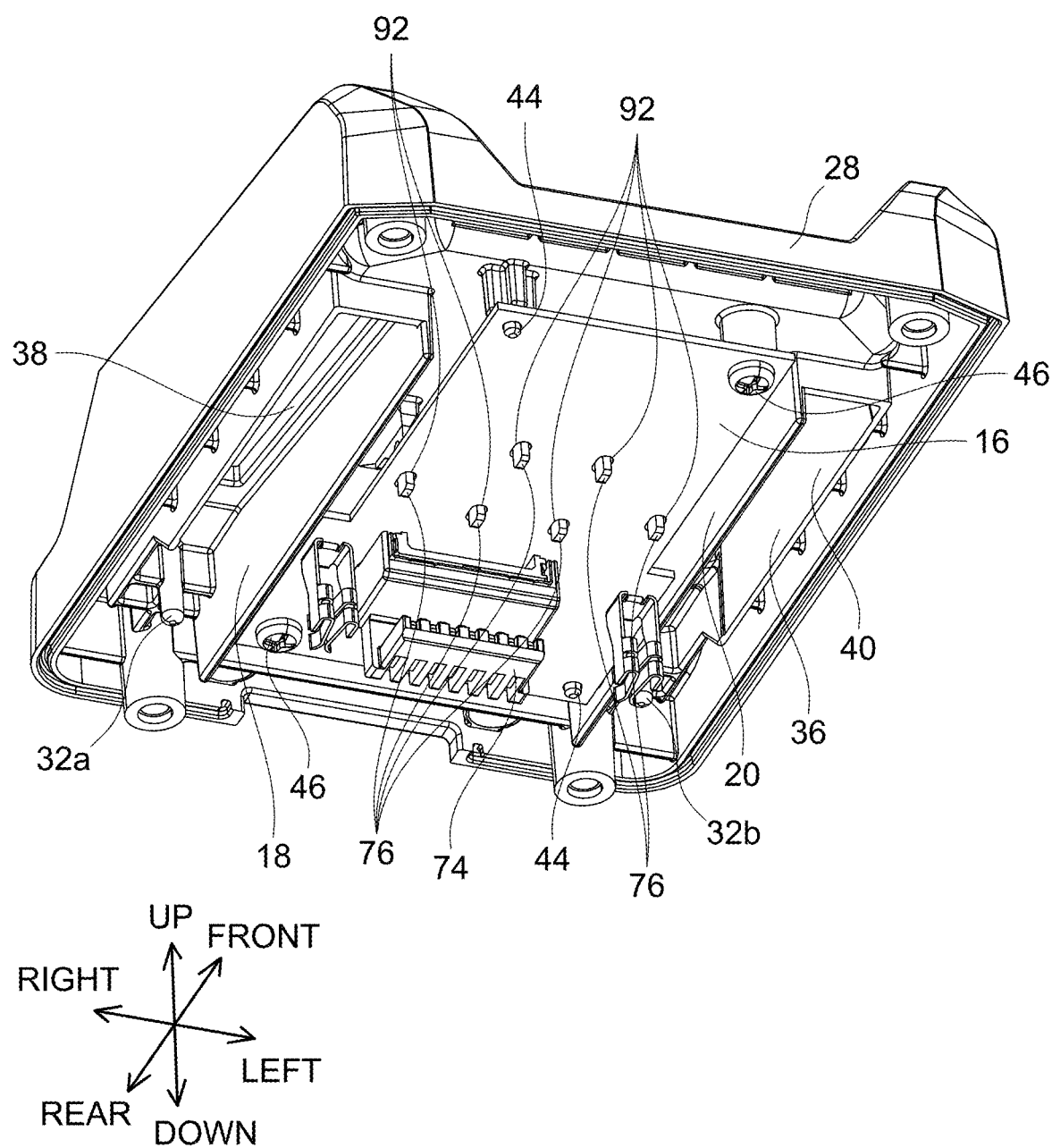
FIG. 5 is a perspective view of the upper housing 28 of the first embodiment in a case where a control board 16 on which a device-side terminal 74 and battery-side terminals 76 are mounted is attached to the upper housing 28.

As shown in FIG. 6, the adapter 2 further comprises a control board 16 and water blocking walls 18, 20. The control board 16 and the water blocking walls 18, 20 are housed inside the upper housing 28 and the lower housing 30. As shown in FIG. 5, the control board 16 is positioned relative to the upper housing 28 by positioning pins 44 of the upper housing 28 at two opposing corners out of four corners of the control board 16. Moreover, the control board 16 is fixed to the upper housing 28 with screws 46 at its other two opposing corners out of the four corners.

The water blocking walls 18, 20 extend downward from an upper inner surface of the upper housing 28 (see FIG. 4). As shown in FIG. 6, the water blocking wall 18 extends in a direction along the left edge of the opening 38 and in the slide direction. The water blocking wall 18 is disposed to isolate the opening 38 from the control board 16. A lower end of the water blocking wall 18 is disposed below the control board 16. The water blocking wall 20 extends in a direction along the right edge of the opening 40 and in the slide direction. The water blocking wall 20 is disposed to isolate the opening 40 from the control board 16. A lower end of the water blocking wall 20 is disposed below the control board 16. The control board 16 is disposed between the water blocking walls 18, 20 with respect to the right-left direction. In a case where water has entered an inside of the housing 12 from the opening 38, the water blocking wall 18 is configured to guide the entered water downward. In a case water has entered the inside of the housing 12 from the opening 40, the water blocking wall 20 is configured to guide the entered water downward.

Figure 7:
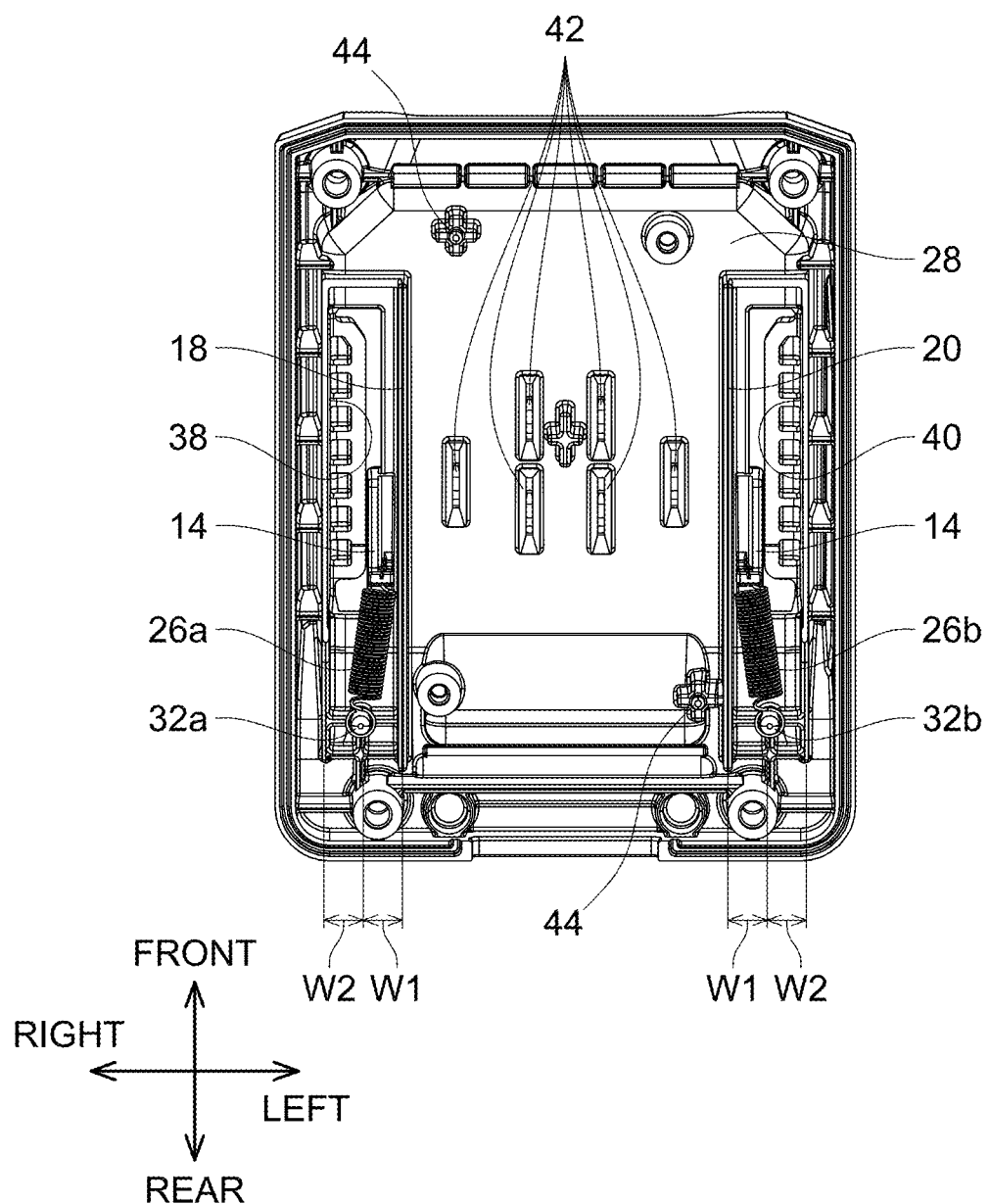
FIG. 7 is a diagram of the upper housing 28 of the first embodiment when seen from below, with biasing springs 26a, 26b and the terminal cover 14 attached thereto.

As shown in FIG. 7, pins 32a, 32b are disposed on the upper inner surface of the upper housing 28 and extend downward. With respect to the right-left direction, the pin 32a is disposed between the water blocking wall 18 and a right edge of the opening 38. With respect to the right-left direction, a distance W1 between the pin 32a and the water blocking wall 18 is approximately equal to a distance W2 between the pin 32a and the right edge of the opening 38. With respect to the right-left direction, the pin 32b is disposed between the water blocking wall 20 and a left edge of the opening 40. With respect to the right-left direction, a distance W1 between the pin 32b and the water blocking wall 20 is approximately equal to a distance W2 between the pin 32b and the left edge of the opening 40.

The biasing spring 26a includes one end attached to the pin 32a. The other end of the biasing spring 26a is attached to the right end of the terminal cover 14. The biasing spring 26a is inclined to be apart from the water blocking wall 18 from its front toward its rear. If the pin 32a is disposed closer to the water blocking wall 18 than the pin 32a in the present embodiment is and the biasing spring 26a is disposed parallel to the front-rear direction, the biasing spring 26a would interfere with the water blocking wall 18, by which it becomes difficult to attach the biasing spring 26a to the pin 32a and to the terminal cover 14. In the present embodiment, since the biasing spring 26a is inclined to be apart from the water blocking wall 18 from its front toward its rear, the biasing spring 26a can be prevented from interfering with the water blocking wall 18, by which it becomes easy to attach the biasing spring 26a to the pin 32a and the terminal cover 14. One end of the biasing spring 26b is attached to the pin 32b. The other end of the biasing spring 26b is attached to the left end of the terminal cover 14. The biasing spring 26b is inclined to be apart from the water blocking wall 20 from its front toward its rear. The biasing spring 26b can therefore be prevented from interfering with the water blocking wall 20, by which it becomes easy to attach the biasing spring 26b to the pin 32b and the terminal cover 14.

As shown in FIG. 8, rails 50, 52 and a terminal mounting portion 54 are formed on the lower housing 30. The rails 50, 52 have a longitudinal direction along the front-rear direction. The rail 50 is disposed at a right end of the lower surface 30a of the lower housing 30. The lower surface 30a is disposed opposite from the upper surface 28a of the upper housing 28. The rail 52 is disposed at a left end of the lower surface 30a of the lower housing 30. The rails 50, 52 are longer than rails (not shown) of the battery-side mounting portion 4a of the battery 4. This prevents the adapter 2 from being erroneously attached to an electrical device other than the battery checker 6, such as an electric power tool or an electric power working machine. The rail 52 extends such that a front end of the rail 52 is positioned forward of a front end of the rail 50. The adapter 2 is thereby detachably attached to the old-model battery checker 6 but is unattachable to the late-model battery checker 6. In a case where the checker-side mounting portion 6a of the battery checker 6 is to be attached to the checker mounting portion 8 of the adapter 2, the rails 50, 52 guide the checker-side mounting portion 6a in the slide direction. The terminal mounting portion 54 is disposed between the rails 50, 52.

The adapter 2 further comprises a hook 130. The hook 130 is disposed at a rear end of the adapter 2. The hook 130 usually protrudes downward relative to the lower surface 30a of the lower housing 30 by being biased by a biasing spring 132 (see FIG. 9). The hook 130 has a longitudinal direction along the up-down direction. The adapter 2 is held by the battery checker 6 by the hook 130 being engaged in an engagement groove (not shown) defined in the upper surface of the battery checker 6.

As shown in FIG. 6, the adapter 2 further comprises inner walls 22, 24. The inner walls 22, 24 are housed inside the upper housing 28 and the lower housing 30. The inner walls 22, 24 extend upward from a lower inner surface of the lower housing 30. The inner walls 22, 24 have a longitudinal direction along the front-rear direction. The inner wall 22 is disposed leftward of the water blocking wall 18 and rightward of the control board 16. An upper end of the inner wall 22 is disposed above the control board 16 and the lower end of the water blocking wall 18. The inner wall 24 is disposed rightward of the water blocking wall 20 and leftward of the control board 16. An upper end of the inner wall 24 is disposed above the control board 16 and the lower end of the water blocking wall 20. With respect to the right-left direction, the control board 16 is disposed between the inner walls 22, 24. With respect to the right-left direction, the inner walls 22, 24 are disposed between the water blocking walls 18, 20. With respect to the right-left direction, the inner wall 22 overlaps the water blocking wall 18, and the inner wall 24 overlaps the water blocking wall 20, by which the inner walls 22, 24 and the water blocking walls 18, 20 form a labyrinth structure. This can further prevent the water that has entered the inside of the housing 12 from the openings 38, 40 from reaching the control board 16 in comparison with a case where the adapter 2 includes only one of the water blocking walls 18, 20 and the inner walls 22, 24.

Steps 58, 60 are formed at an inner surface of the lower housing 30. The step 58 is disposed rightward of the inner wall 22 and the water blocking wall 18. A portion of the lower inner surface of the lower housing 30 located rightward of the step 58 is located above a portion of the lower inner surface of the lower housing 30 between the step 58 and the inner wall 22. A water blocking groove 64 is formed between the step 58 and the inner wall 22. The step 60 is disposed leftward of the inner wall 24 and the water blocking wall 20. A portion of the lower inner surface of the lower housing 30 located leftward of the step 60 is located above a portion of the lower inner surface of the lower housing 30 between the step 60 and the inner wall 24. A water blocking groove 66 is formed between the step 60 and the inner wall 24. The water blocking grooves 64, 66 have a longitudinal direction along the front-rear direction. The lower end of the water blocking wall 18 is disposed in the water blocking groove 64. The lower end of the water blocking wall 20 is disposed in the water blocking groove 66. The water blocking grooves 64, 66 are configured to receive water guided by the water blocking walls 18, 20, respectively.

Drain openings 68, 70 are formed in the lower housing 30. The drain opening 68 is disposed at a front end of the water blocking groove 64. The drain opening 70 is disposed at a front end of the water blocking groove 66.

In a case where the adapter 2 is attached to the battery checker 6 placed on a horizontal surface, the lower surface 30a of the lower housing 30 is inclined downward relative to the horizontal surface from its rear toward its front. Due to this, each of the water blocking grooves 64, 66 is inclined downward relative to the horizontal surface from its rear toward its front. This allows water that has dropped from the water blocking walls 18 to the water blocking groove 64 to flow forward to be drained from the drain opening 68 to an outside of the housing 12. Similarly, this allows water that has dropped from the water blocking wall 20 to the water blocking groove 66 to flow forward to be drained from the drain opening 70 to an outside of the housing 12. The water that has been drained from the drain openings 68, 70 runs on an outer surface of the battery checker 6 and drops downward from the battery checker 6.

In a case where the adapter 2 is placed on the horizontal surface as well, the lower surface 30a of the lower housing 30 is inclined downward relative to the horizontal surface from its rear toward its front. Due to this, each of the water blocking grooves 64, 66 is inclined downward relative to the horizontal surface from its rear toward its front. This allows the water that has moved from the water blocking wall 18 to the water blocking grooves 64 to flow forward to be drained from the drain opening 68 to the outside of the housing 12. Similarly, this allows the water that has moved from the water blocking wall 20 to the water blocking groove 66 to flow forward to be drained from the drain opening 70 to the outside of the housing 12.

Figure 9:
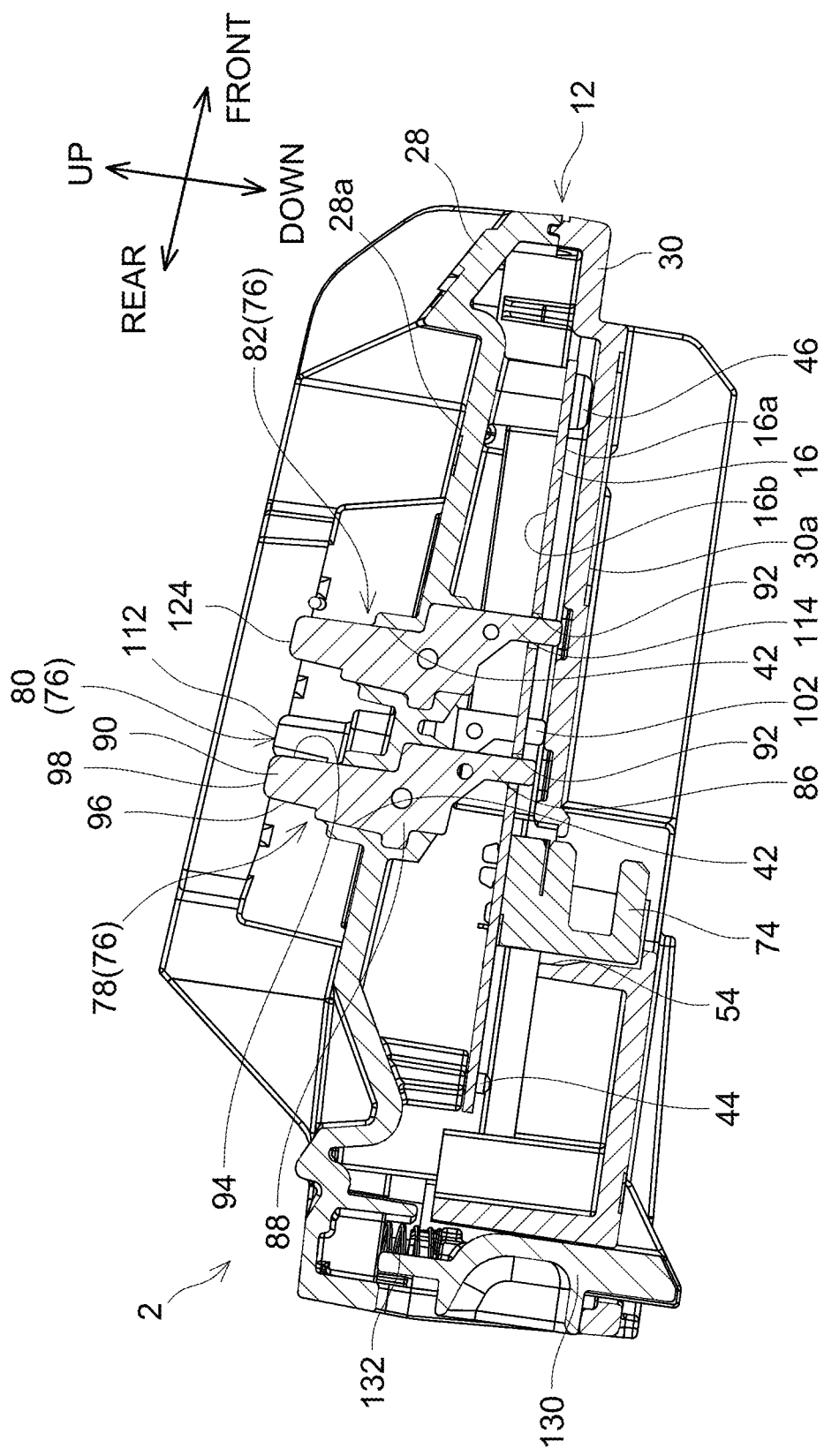
FIG. 9 is a cross-sectional view of the adapter 2 of the first embodiment cut perpendicularly to a right-left direction.

As described above, the adapter 2 comprises the control board 16. As shown in FIG. 9, the control board 16 is disposed parallel to the lower surface 30a of the lower housing 30. The control board 16 is inclined relative to the upper surface 28a of the upper housing 28. In the present embodiment, the upper surface 28a of the upper housing 28 is inclined relative to the lower surface 30a of the lower housing 30 at an angle of 5 degrees. The upper surface 28a of the upper housing 28 may be inclined relative to the lower surface 30a of the lower housing 30 at an angle that is larger than 0 degrees and smaller than or equal to 10 degrees, or at an angle that is larger than 0 degrees and smaller than or equal to 15 degrees.

A device-side terminal 74 is mounted on a lower surface 16a of the control board 16. The device-side terminal 74 extends downward from the lower surface 16a of the control board 16, is then bent and extends forward. The device-side terminal 74 protrudes to an outside of the lower housing 30 through the terminal mounting portion 54 of the lower housing 30. When the adapter 2 is attached to the battery checker 6, the device-side terminal 74 is electrically connected to terminal(s) of the battery checker 6 (not shown).

Six battery-side terminals 76 are mounted on an upper surface 16b of the control board 16. The upper surface 16b is opposite from the lower surface 16a of the control board 16. The six battery-side terminals 76 respectively protrude to an outside of the upper housing 28 through the terminal mounting portions 42 of the upper housing 28. When the adapter 2 is attached to the battery 4, the six battery-side terminals 76 are electrically connected to terminal(s) of the battery 4 (not shown). Positions of the six battery-side terminals 76 mounted on the control board 16 in the front-rear direction are forward of a position of the device-side terminal 74 mounted on the control board 16 in the front-rear direction. In other words, the six battery-side terminals 76 are offset from the device-side terminal 74 in the front-rear direction.

As shown in FIG. 3, the six battery-side terminals 76 are classified as two first battery-side terminals 78, two second battery-side terminals 80, and two third battery-side terminals 82. The two first battery-side terminals 78 are arranged in the right-left direction. The two third battery-side terminals 82 are arranged in the right-left direction. With respect to the right-left direction, one of the second battery-side terminals 80 is disposed rightward of the first battery-side terminals 78 and the third battery-side terminals 82, and the other of the second battery-side terminals 80 is disposed leftward of the first battery-side terminals 78 and the third battery-side terminals 82. As shown in FIG. 9, with respect to the front-rear direction, the first battery-side terminals 78, the second battery-side terminals 80, and the third battery-side terminals 82 are arranged in this order from rear toward front. The first battery-side terminals 78, the second battery-side terminals 80, and the third battery-side terminals 82 each have a shape equal to one another. Therefore, a detailed structure of the battery-side terminals 76 will be described by taking one of the first battery-side terminals 78 as an example.

As shown in FIG. 9, the first battery-side terminal 78 comprises a base 86, a fixed portion 88, and a protrusion 90. A lower portion of the base 86 is inserted into a mounting hole 92 of the control board 16. The base 86 extends vertically from the upper surface 16b of the control board 16. The base 86 is fixed to the control board 16 with use of, for example, solder. The fixed portion 88 is disposed on the base 86. The fixed portion 88 is fixed to the upper housing 28 through the terminal mounting portion 42. The protrusion 90 is disposed on the fixed portion 88. The protrusion 90 protrudes to the outside of the upper housing 28. The protrusion 90 includes a front surface 94, a rear surface 96, and a distal surface 98. With respect to the front-rear direction, the front surface 94 of the protrusion 90 is a surface of the protrusion 90 on its front side, and the rear surface 96 of the protrusion 90 is a surface of the protrusion 90 on its rear side. The front surface 94 is perpendicular to the upper surface 16b of the control board 16 and is inclined relative to a direction perpendicular to the upper surface 28a of the upper housing 28. The rear surface 96 is perpendicular to the upper surface 28a of the upper housing 28 and is inclined relative to a direction perpendicular to the upper surface 16b of the control board 16. The rear surface 96 is perpendicular to the slide direction in which the battery 4 is slid with respect to the adapter 2. The distal surface 98 is a surface located farthest from the upper surface 28a of the upper housing 28. The distal surface 98 is parallel to the upper surface 28a of the upper housing 28 and is inclined relative to the direction perpendicular to the upper surface 16b of the control board 16. The distal surface 98 is parallel to the slide direction in which the battery 4 is slid with respect to the adapter 2.

A height from the upper surface 28a of the upper housing 28 to the distal surface 98 of the first battery-side terminal 78 is equal to a height from the upper surface 28a of the upper housing 28 to a distal surface 112 of the second battery-side terminal 80. The upper surface 28a of the upper housing 28 is inclined relative to the upper surface 16b of the control board 16, and approaches the upper surface 16b of the control board 16 toward its front. This allows a base 102 of the second battery-side terminal 80 to be inserted deeper into a corresponding one of the mounting holes 92 of the control board 16 than the base 86 of the first battery-side terminal 78 is. A height from the upper surface 28a of the upper housing 28 to a distal surface 124 of the third battery-side terminal 82 is larger than the height from the upper surface 28a of the upper housing 28 to the distal surface 98 of the first battery-side terminal 78 by a predetermined amount. The predetermined amount is, for example, equal to or smaller than 1 mm. Since the predetermined amount is set to be equal to or smaller than 1 mm, the battery 4 can be prevented from catching on the third battery-side terminals 82 when the battery 4 is to be attached to the adapter 2. Moreover, an amount by which a base 114 of the third battery-side terminal 82 protrudes downward from the lower surface 16a of the control board 16 can be decreased in comparison with a case where the height from the upper surface 28a of the upper housing 28 to the distal surface 124 of the third battery-side terminal 82 is equal to the height from the upper surface 28a of the upper housing 28 to the distal surface 98 of the first battery-side terminal 78. The adapter 2 can thereby be downsized with respect to the up-down direction.

Next, a method of mounting the battery-side terminals 76 on the upper surface 16b of the control board 16 will be described. Firstly, the six battery-side terminals 76 are molded integrally with the upper housing 28 by insert molding. Next, the two opposing corners out of the four corners of the control board 16 are inserted into the positioning pins 44 of the upper housing 28. The control board 16 is thereby positioned relative to the upper housing 28, and the bases of the six battery-side terminals 76 are respectively inserted into the mounting holes 92 of the control board 16 to protrude downward from the lower surface 16a of the control board 16. Subsequently, the other two opposing corners out of the four corners of the control board 16 are fixed with the screws 46. Afterwards, the bases of the six battery-side terminals 76 are soldered to the control board 16.

The adapter 2 of the present embodiment is configured to connect the battery 4 and the battery checker 6 to each other. The adapter 2 comprises the control board 16, the battery-side terminals 76, and the device-side terminal 74. As shown in FIG. 8, the battery-side terminals 76 are mounted on the upper surface 16b of the control board 16 and configured to be electrically connectable to the battery 4. The device-side terminal 74 is mounted on the lower surface 16a of the control board 16 and configured to be electrically connectable to the battery checker 6, the lower surface 16a being opposite from the upper surface 16b. In the above configuration, since the battery-side terminals 76 and the device-side terminal 74 are both mounted on the control board 16, the battery-side terminals 76 and the device-side terminal 74 are disposed on the control board 16 without use of another member such as a lead. Due to this, a space for disposing the lead is not required to be provided, which can prevent increase in size of the adapter 2.

The adapter 2 further comprises: the battery mounting portion 10 to which the battery-side mounting portion 4a of the battery 4 is to be detachably attached; and the checker mounting portion 8 to which the checker-side mounting portion 6a of the battery checker 6 is to be detachably attached. The battery-side mounting portion 4a of the battery 4 may be configured to be unattachable to the checker-side mounting portion 6a of the battery checker 6. The above configuration enables the battery 4 and the battery checker 6, which cannot be connected directly to each other, to be connected to each other via the adapter 2.

The battery checker 6 is configured to be detachably attached to the adapter 2 by being slid in a slide direction with respect to the adapter 2. The battery-side terminals 76 are disposed to be offset from the device-side terminal 74 in the slide direction. In a case where the battery-side terminals 76 are mounted on the upper surface 16b of the control board 16 and the device-side terminal 74 is mounted on the lower surface 16a of the control board 16, the battery-side terminals 76 need to be disposed to be offset from the device-side terminal 74. If battery-side terminals 76 are disposed to be offset from the device-side terminal 74, however, the adapter 2 may be increased in size. In the above configuration, the battery-side terminals 76 are disposed to be offset from the device-side terminal 74 in the slide direction. In a configuration in which the battery checker 6 is configured to be detachably attached by being slid with respect to the adapter 2, the adapter 2 usually has an enough size in the slide direction, thus the adapter 2 can be prevented from being increased in size in the slide direction, even in a case where the battery-side terminals 76 are disposed to be offset from the device-side terminal 74 in the slide direction.

As shown in FIG. 5, the adapter further comprises: the housing 12 which houses the control board 16; and the water blocking walls 18, 20 disposed inside the housing 12. The housing 12 includes the openings 38, 40 facing the battery 4 when the battery 4 is attached to the adapter 2. Each of the water blocking walls 18, 20 is disposed to isolate corresponding one of the openings 38, 40 from the control board 16. In the above configuration, each of the water blocking walls 18, 20 prevents water that has entered the inside of the housing from corresponding one of the openings 38, 40 from flowing toward the control board. This can prevent the water from reaching the control board 16.

As shown in FIG. 5, the housing 12 includes the water blocking grooves 64, 66 each configured to receive water which has entered the inside of the housing 12 from corresponding one of the openings 38, 40 and flows along corresponding one of the water blocking walls 18, 20. The distal end of each of the water blocking walls 18, 20 is disposed in corresponding one of the water blocking grooves 64, 66. In the above configuration, each of the water blocking grooves 64, 66 functions as a water receiver configured to receive the water that has entered the inside of the housing 12 from corresponding one of the openings 38, 40. This can prevent the water from reaching the control board 16.

As shown in FIG. 5, the housing 12 further includes the drain openings 68, 70 each configured to drain water which has entered the inside of the housing 12 from corresponding one of the openings 38, 40 to the outside of the housing 12. Each of the drain openings 68, 70 is disposed in corresponding one of the water blocking grooves 64, 66. In the above-described configuration, the water trapped in each of the water blocking grooves 64, 66 is drained from corresponding one of the drain openings 68, 70 to the outside of the housing 12. This can prevent the water from remaining trapped inside the housing 12.

The adapter 2 further comprises the housing 12 which houses the control board 16. The housing 12 includes the upper surface 28a and the lower surface 30a. The battery 4 is attached to the upper surface 28a. The lower surface 30a is opposite from the upper surface 28a and the battery checker 6 is attached to the lower surface 30a. As shown in FIG. 8, the upper surface 28a is inclined relative to the lower surface 30a. In the above configuration, the upper surface 28a is inclined relative to the lower surface 30a. Therefore, even when a member such as the hook 130 is provided, the housing 12 can have a required height at and near a portion where the member such as the hook 130 is provided and can have a decreased height at another The upper surface 28a is inclined relative to the lower surface 30a at an angle that is larger than 0 degrees and smaller than or equal to 10 degrees. The above configuration can prevent the upper surface 28a from being excessively inclined relative to the lower surface 30a. This can prevent increase in size of the adapter 2.

The battery 4 is configured to be detachably attached to the adapter 2 by being slid with respect to the adapter 2. Each of the battery-side terminals 76 comprises the protrusion 90 which protrude from the upper surface 28a of the upper housing 28. The protrusion 90 includes the distal surface 98 located farthest from the upper surface 28a. The distal surface 98 is parallel to the upper surface 28a. The above configuration can prevent the distal surface 98 of each of the battery-side terminals 76 from catching on the battery 4 when the battery 4 is slid along the upper surface 28a. This enables the battery 4 to be easily attached to the adapter 2.

The front direction is defined as a direction in which the battery 4 is slid to be attached to the adapter 2. The protrusion 90 includes the rear surface 96. The rear surface 96 is perpendicular to the upper surface 28a. The above configuration can prevent the rear surface 96 of each of the battery-side terminals 76 from catching on the battery 4 when the battery 4 is slid along the upper surface 28a. This enables the battery 4 to be easily attached to the adapter 2.

The adapter 2 of the present embodiment is configured to connect the battery 4 and the battery checker 6 to each other. The adapter 2 comprises the housing 12, the control board 16, and the terminals 74, 76. The control board 16 is housed in the housing 12. The terminals 74, 76 are mounted on the control board 16. The housing 12 includes the upper surface 28a and the lower surface 30a. The battery 4 is attached to the upper surface 28a. The lower surface 30a is opposite from the upper surface 28a and the battery checker 6 is attached to the lower surface 30a. As shown in FIG. 8, the upper surface 28a is inclined relative to the lower surface 30a. In the above configuration, the upper surface 28a is inclined relative to the lower surface 30a. Therefore, even when a member such as the hook 130 is provided, the housing 12 can have a required height at and near a portion where the member such as the hook 130 is provided and can have a decreased height at another portion. This can further downsize the adapter 2.

Corresponding Relationship

The upper surface 16b of the control board 16 is an example of a "first surface of the control board", and the lower surface 16a of the control board 16 is an example of a "second surface of the control board". The upper surface 28a of the upper housing 28 is an example of a "battery mounting surface", and the lower surface 30a of the lower housing 30 is an example of a "device mounting surface".

Variant of First Embodiment

Figure 10:
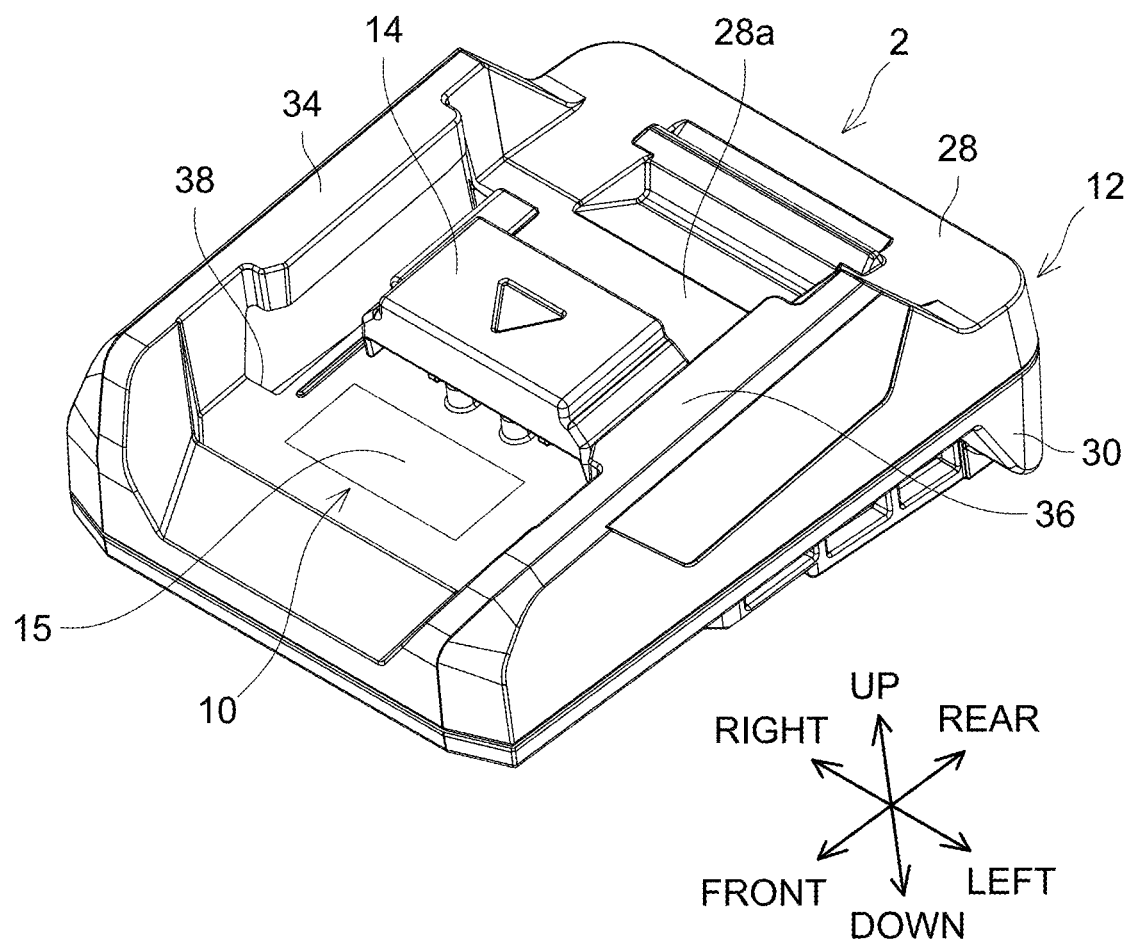
FIG. 10 is a perspective view of the adapter 2 of a variant of the first embodiment with the terminal cover 14 being at the protecting position.

With reference to FIG. 10, a variant of the first embodiment will be described. The variant of the first embodiment will be described regarding its differences from the first embodiment. The same reference signs well be allocated to the same points as the first variant and the detailed explanation thereof will be omitted. In the variant of the first embodiment, the adapter 2 further includes a display 15. The display 15 is disposed on the upper surface 28a of the upper housing 28. The display 15 is, for example, an LED panel. The display 15 is configured to display, for example, information on connection between the adapter 2 and the battery checker 6 by being controlled by the control board 16. An operator determines whether the adapter 2 is correctly connected to the battery checker 6 by seeing the information on connection displayed on the display 15.

The adapter 2 comprises the display 15 disposed on the upper surface 28a and configured to display information of the battery checker 6. According to the above configuration, when the lower surface 30a is placed horizontal to a placement surface, the upper surface 28a is inclined relative to the placement surface. The display 15 is thus inclined relative to the placement surface. This enables an operator to easily see the display 15 in comparison with a case where the display 15 is horizontal to the placement surface.

Second Embodiment

A second embodiment will be described regarding its differences from the first embodiment. The same reference signs well be allocated to the same points as the first variant and the detailed explanation thereof will be omitted. In the second embodiment, the control board 16 is disposed parallel to the upper surface 28a of the upper housing 28 and is inclined relative to the lower surface 30a of the lower housing 30. The terminal 74 in the second embodiment is mounted on the upper surface 16b of the control board 16. The terminal 74 is electrically connectable to the battery 4. The terminals 76 in the second embodiment are mounted on the lower surface 16a of the control board 16. The terminals 76 are electrically connectable to the battery checker 6. A structure of the terminals 76 will be described by taking one of the first terminals 78 out of the terminals 76 as an example.

The base 86 of the first terminal 78 is fixed to the control board 16 with use of, for example, solder. The fixed portion 88 of the first terminal 78 is fixed to the lower housing 30. The protrusion 90 of the first terminal 78 protrudes to the outside of the lower housing 30. The front surface 94 of the protrusion 90 is perpendicular to the lower surface 16a of the control board 16 and is inclined relative to a direction perpendicular to the lower surface 30a of the lower housing 30. The rear surface 96 of the protrusion 90 is perpendicular to the lower surface 30a of the lower housing 30 and is inclined relative to a direction perpendicular to the lower surface 16a of the control board 16. The distal surface 98 of the protrusion 90 is parallel to the lower surface 30a of the lower housing 30 and is parallel to the front-rear direction in which the battery checker 6 is slid with respect to the adapter 2.

The battery checker 6 is configured to be detachably attached to the adapter 2 by being slid with respect to the adapter 2. Each of the terminals 76 comprises the protrusion 90 which protrudes from the lower surface 30a. The protrusion 90 includes the distal surface 98 located farthest from the lower surface 30a. The distal surface 98 is parallel to the lower surface 30a. The above configuration can prevent the distal surface 98 of each of the terminals 76 from catching on the battery checker 6 when the battery checker 6 is slid along the lower surface 30a. This enables the adapter 2 to be easily attached to the battery checker 6.

A front direction is defined as a direction in which the adapter 2 is slid to be attached to the battery checker 6. The protrusion 90 includes the rear surface 96. The rear surface 96 is perpendicular to the lower surface 30a. The above configuration can prevent the rear surface 96 of each of the terminals 76 from catching on the battery checker 6 when the battery checker 6 is slid along the lower surface 30a. This enables the adapter 2 to be easily attached to the battery checker 6.

The adapter 2 according to an embodiment may be configured to connect the battery 4 to an electrical device other than the battery checker 6. The other electrical device may be, for example, an electric power tool such as a driver or a drill, or an electric power working machine such as a string trimmer or a blower.

In the adapter 2 according to an embodiment, the front surfaces 94 of the first battery-side terminals 78 may be perpendicular to the upper surface 28a of the upper housing 28. Respective front surfaces of the second battery-side terminals 80 and the third battery-side terminals 82 may also be perpendicular to the upper surface 28a of the upper housing 28.

The adapter 2 according to an embodiment may not comprise the water blocking walls 18, 20. The adapter 2 may not comprise the inner walls 22, 24. The adapter 2 may comprise neither of the water blocking walls 18, 20 nor the inner walls 22, 24.

In the adapter 2 according to an embodiment, the rear surfaces 96 of the first battery-side terminals 78 may be inclined relative to the upper surface 28a of the upper housing 28. Respective rear surfaces of the second battery-side terminals 80 and the third battery-side terminals 82 may be inclined relative to the direction perpendicular to the upper surface 28a of the upper housing 28.

In the adapter 2 according to an embodiment, the positions of the six battery-side terminals 76 mounted on the control board 16 in the front-rear direction may be rearward of the position of the device-side terminal 74 mounted on the control board 16 in the front-rear direction.

What is claimed is:

1. An adapter configured to connect a battery and an electrical device to each other, the adapter comprising:
    a housing including:
        a battery mounting surface to which the battery is to be attached; and
        a device mounting surface to which the electrical device is to be attached, the device mounting surface being opposite from the battery mounting surface and inclined relative to the battery mounting surface;
    a control board housed in the housing; and
    a terminal member directly mounted on the control board and extending from the control board in a direction away from the control board.

2. The adapter according to claim 1, wherein
the battery mounting surface is inclined relative to the device mounting surface at an angle that is larger than 0 degrees and smaller than or equal to 10 degrees.

3. The adapter according to claim 1, wherein
the battery is configured to be detachably attached to the adapter by being slid with respect to the adapter,
the terminal member comprises a protrusion which protrudes from the battery mounting surface,
the protrusion includes a distal surface located farthest from the battery mounting surface, and
the distal surface is parallel to the battery mounting surface.

4. The adapter according to claim 3, wherein
the battery is slid to be attached to the adapter in a front direction,
the protrusion includes a rear surface, and
the rear surface is perpendicular to the battery mounting surface.

5. The adapter according to claim 1, wherein
the electrical device is configured to be detachably attached to the adapter by being slid with respect to the adapter,
the terminal member comprises a protrusion which protrudes from the device mounting surface,
the protrusion includes a distal surface located farthest from the device mounting surface, and
the distal surface is parallel to the device mounting surface.

6. The adapter according to claim 5, wherein the adapter is slid to be attached to the electrical device in a front direction,
the protrusion includes a rear surface, and
the rear surface is perpendicular to the device mounting surface.

7. The adapter according to claim 1, further comprising a display disposed on the battery mounting surface and configured to display information of the electrical device.

8. The adapter according to claim 1, further comprising:
    a battery rail disposed on the battery mounting surface, the battery rail being configured to allow the battery to slide with respect to the adapter; and
    a device rail disposed on the device mounting surface, the device rail being configured to allow the adapter to slide with respect to the electrical device.

* * * * *